(12) United States Patent
Kawaguchi et al.

(10) Patent No.: US 6,563,263 B1
(45) Date of Patent: May 13, 2003

(54) MULTI-COLORED ORGANIC EL DEVICE WITH PROTECTIVE LAYER

(75) Inventors: Koji Kawaguchi, Kanagawa (JP); Toshiyuki Kanno, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/388,546

(22) Filed: Sep. 2, 1999

(30) Foreign Application Priority Data

Sep. 7, 1998 (JP) ............................................ 10-252565

(51) Int. Cl.⁷ .............................................. H05B 33/22
(52) U.S. Cl. ........................ 313/509; 313/504; 313/512
(58) Field of Search ............................... 313/504, 512, 313/506, 503, 509

(56) References Cited

U.S. PATENT DOCUMENTS

| | | | |
|---|---|---|---|
| 5,294,870 A | * 3/1994 | Tang et al. ................... | 313/504 |
| 5,589,732 A | * 12/1996 | Okibayashi et al. ......... | 313/506 |
| 5,648,173 A | * 7/1997 | Blizzard ...................... | 428/446 |
| 5,909,081 A | * 6/1999 | Eida et al. ................... | 313/504 |
| 6,322,860 B1 | * 11/2001 | Stein et al. .................. | 428/1.26 |
| 6,368,715 B1 | * 4/2002 | Williams et al. ............. | 428/428 |

OTHER PUBLICATIONS

Patent Abstract of Japan, No. 01–229203, publication date Sep. 12, 1989, Applicant Mitsui Toatsu Chem. Inc.
Patent Abstract of Japan, No. 04–097102, publication date March 30, 1992, Applicant Sanyo Chem. Ind. Ltd.
Patent Abstract of Japan, No. 60–216307, publication date Oct. 29, 1985, Applicant Japan Synthetic Rubber Co., Ltd.

* cited by examiner

Primary Examiner—Michael H. Day
(74) Attorney, Agent, or Firm—Kanesaka & Takeuchi

(57) ABSTRACT

A multi-colored organic EL device for a flat display includes a transparent substrate, a plurality of phosphor layers arranged on a surface of the substrate as a color conversion filter, a protective layer flatly coated on the phosphor layers, and an organic EL cell formed directly on the protective layer. The protective layer is formed of a coating resin having a curing temperature not to cause deterioration in the fluorescence of the phosphor layers, a glass transition temperature more than 100° C., and surface hardness more than 2H on the pencil hardness. The organic EL cell includes a light-emitting layer for emitting light when carriers are injected therein. The protective layer keeps the phosphor layers intact and can coat flatly over uneven phosphor layers. The protective layer prevents effects of post-coating processes on the phosphor layers, and allows direct formation of the organic EL cell on the protective layer.

8 Claims, 5 Drawing Sheets

MULTI-COLORED ORGANIC EL DEVICE WITH PROTECTIVE LAYER

BACKGROUND OF THE INVENTION
RELATED ART STATEMENT

The present invention relates to a multi-colored organic electroluminescence (hereinafter referred to as "EL") device used for an organic EL display and the like.

A layered-type EL device, which exhibits a high luminosity of 1,000 cd/m$^2$ or more under the applied voltage of 10V, was reported by Tang et al. in Appl. Phys. Lett. vol. 51, p. 913 (1987). An organic EL device has been actively researched to aim at practical use since the report. The organic EL device is a thin film device of spontaneous emission of light, and has features of low driving voltage, high resolution, and wide-angle visibility, which are not obtainable by other elements. The organic EL device is expected to apply to a flat panel display, and for wide applications of the organic EL element, it is indispensable to be displayed by multi-color.

A first method for the multi-colored display is to utilize organic EL elements having the three primary colors, wherein a plurality of pixels for the three primary colors is arranged by successively patterning on the same plane. A second method for the multi-colored display is to utilize the EL cells emitting white light and three kinds of color filters disposed opposite to the EL cells, each of the color filter transmitting red, green or blue light.

However, patterning of the EL elements for the three primary colors decreases the luminescence efficiency of the elements.

Moreover, the complicated processes of the patterning of the pixels for the three primary colors render the mass production of the multi-colored organic EL device difficult. Further, an electro-luminescent material for red color, in particular, with good purity has not been found. Thus, the first method for the multi-colored organic EL device has not bet been used practically. The second method utilizing the color filter has not been used practically either, since there is no organic EL cell with stable and ample luminosity in white light.

Accordingly, a third method utilizing a color conversion filter has been developed in recent years (Japanese Unexamined Patent Publications No. 3-152897 and No. 5-258860).

The color conversion filter comprises a material which absorbs luminescent light emitted by an organic EL cell and emits fluorescent light with the wavelengths in the visible region. Because the luminescence of the organic EL cell in the color conversion method is not limited to white light, it is possible to utilize an organic EL cell with higher luminosity at an appropriate wavelength other than white light. In fact, a color conversion method performs at a conversion efficiency of 60% or more by utilizing a blue light emitting organic EL cell and a color conversion filter which converts the blue light to light with a longer wave length.

Manufacturing an organic EL device in the color conversion method requires special consideration on the distance between the color conversion filter and the organic EL cell. As the distance becomes longer, the light leakage from the adjoining pixel increases, so that angle of visibility becomes poor. Consequently, a preferable configuration is a direct mounting of the organic EL cell on the color conversion filter. Known phosphor pigments for the color conversion filter are rhodamine pigments, pyridine pigments, oxazine pigments, and coumalin pigments, etc. (Japanese Unexamined Patent Publications No. 8-78158, No. 8-222369, No. 8-279394, No. 8-286033, No. 9-106888, No. 9-208944, No. 9-245511, No. 9-330793, and No. 10-12379). However, the conventional phosphor pigments are often susceptible to the factors, such as ultraviolet radiation, heat or organic solvents, and result in shifting of fluorescent wavelength or quenching of fluorescence. Therefore, when the organic EL cell is directly formed on the color conversion filter, the function of the color conversion filter may disappear due to plasma in a sputtering process for a transparent electrode or peeling liquid used in a patterning process of the transparent electrode.

The thicknesses of the color conversion filters corresponding to the respective three primary colors are different from each other because differences in the color conversion efficiencies of fluorescent materials for the three primary colors are adjusted by the film thicknesses of the color conversion filters to yield desired tone of color. Accordingly, steps are formed in the color conversion filters 2, 3, 4 on a glass substrate 1, as shown in FIG. 4. Direct formation of the organic EL cells on the uneven color conversion filters often causes disconnection of the transparent electrodes and irregular film thicknesses of organic light-emitting layers, rendering the luminescence from the organic EL cells unstable.

A conventional liquid crystal display is provided with a protective layer on the color filters. The protective layer insulates the substrate and makes the substrate flat, and prevents physical destruction of the elements of the display. The materials studied so far for the protective layer include acrylic resin (Japanese Unexamined Patent Publication No. 60-216307), epoxy resin (Japanese Unexamined Patent Publications No. 4-97102, and No. 3-8652), and polyimide resin (Japanese Unexamined Patent Publication No. 1-229203).

However, the conventional materials mentioned above require ultraviolet irradiation or heat-treatment at high temperature of 200° C. or more to form the protective layer. These processes deteriorate the characteristic of the color conversion filter underneath the protective layer. Hence, the conventional materials are not suitable for use as a protective layer of a color conversion filter.

Accordingly, it is desirable to develop a new material for the protective layer, which enables direct formation of the organic EL cells on the color conversion filters. The protective layer is required to be formed without deteriorating performances of the phosphor pigments in the color conversion filter, to provide flat surface absorbing the steps of the color conversion filters, and to protect the phosphor pigments in the subsequent processes.

The present invention has been made in view of the above problems. An object of the present invention is to provide a multi-colored organic EL device having a protective layer for color conversion filters allowing organic EL cells directly formed on the protective layer.

Another object of the invention is to provide a multi-colored organic EL device as stated above, wherein the protective layer can be coated on the color conversion filters without deteriorating the phosphor pigments in the color conversion filter, and to flatten the uneven color conversion filters.

A further object of the invention is to provide a multi-colored organic EL device as stated above, wherein the protective layer can protect the phosphor pigments from the post-processing.

A still further object of the invention is to provide a method for manufacturing a multi-colored organic EL device.

Further objects and advantages of the invention will be apparent from the following description of the invention.

SUMMARY OF THE INVENTION

Intensive investigations lead the inventors to achieve the above described objects. The protective layer for the color conversion filter in the invention utilizes a coating resin which enables forming a protective film at a temperature at which the function of the color conversion material does not disappear. The protective layer has a glass transition temperature (hereinafter referred to as "Tg") of higher than 100° C., and has a hardness of 2H on the pencil hardness. The protective layer can be formed without deteriorating performances of the color conversion filters and effectively protects the color conversion filters against stresses during depositing layers of the organic EL cell on the protective layer.

The multi-colored organic EL device of the invention comprises a transparent substrate, a plurality of different phosphor layers arranged separately in a plane on the surface of the substrate, an organic EL cell formed above the phosphor layers, and a protective layer between the phosphor layers and the organic EL cell. The EL cell comprises an organic light-emitting layer that emits light when electric charges are injected to the light-emitting layer. The phosphor layers and the light-emitting layer are arranged in such a manner that luminescence from the light-emitting layer irradiates the phosphor layers to cause the phosphor layers fluorescent. The coating resin of the protective layer has a curing temperature at which quenching of fluorescence in the phosphor layers does not occur. The glass transition temperature of the protective layer is more than 100° C., and the surface hardness is more than 2H on the pencil hardness.

One of the phosphor layers can be replaced by a color filter to attain light with the same color purity as the light emitted from the organic light-emitting layer of the organic EL cell.

The coating resin preferably includes one of polynorbornene resins with number average molecular weight from 50,000 to 500,000. Alternatively, the coating resin may include a polymer hybrid resin containing alkoxysilane selected from trialkoxysilane and tetraalkoxysilane.

Moreover, the method for manufacturing a multi-colored organic EL device comprises a step of forming an organic EL cell directly on the protective layer.

Application of the coating resin of this invention to the color conversion filters enables flat-coating for the uneven color conversion filters with the protective layer of film thickness of 10 $\mu$m or less. The organic EL cell is formed directly on the protective layer. This makes the organic EL cell very close to the color filter to provide the multi-colored organic EL device exhibiting a characteristic of wide-angle visibility. The process for preparing a protection structure for the color conversion filter is very simple because the process is only to coat at least one layer on the color conversion filter.

DETAILED DESCRIPTION OF PREFERRED EMBODIMENTS

The followings explain some embodiments of the invention referring to the accompanying drawings.

Figure 1:
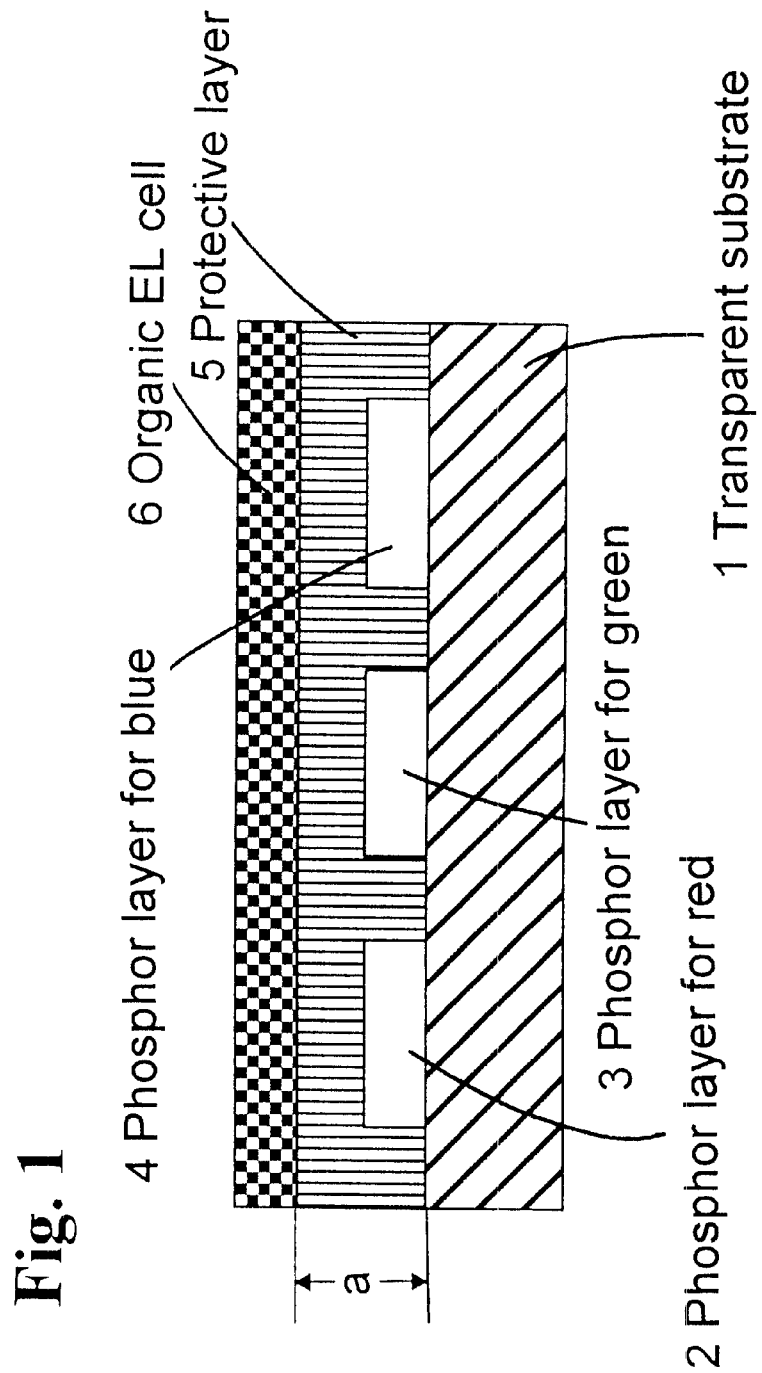
FIG. 1 is a cross sectional view of one embodiment of a multi-colored organic EL device.

FIG. 1 is a cross sectional view of an embodiment of a multi-colored organic EL device of the invention. A color conversion filter comprises a substrate 1, phosphor layers 2, 3 and 4, and a protective layer 5. The substrate 1 is formed of a transparent and stable material, wherein the "stable" means that the material of the substrate 1 does not generate any component which deteriorates the phosphor layers or the organic EL cell from a room temperature to 150° C. The phosphor layers 2, 3 and 4 containing phosphor materials for red, green and blue, respectively, are arranged on the substrate 1. At least one protective layer 5 is formed on the color conversion filter. An organic EL cell 6 is disposed directly on the protective layer 5.

Figure 5:
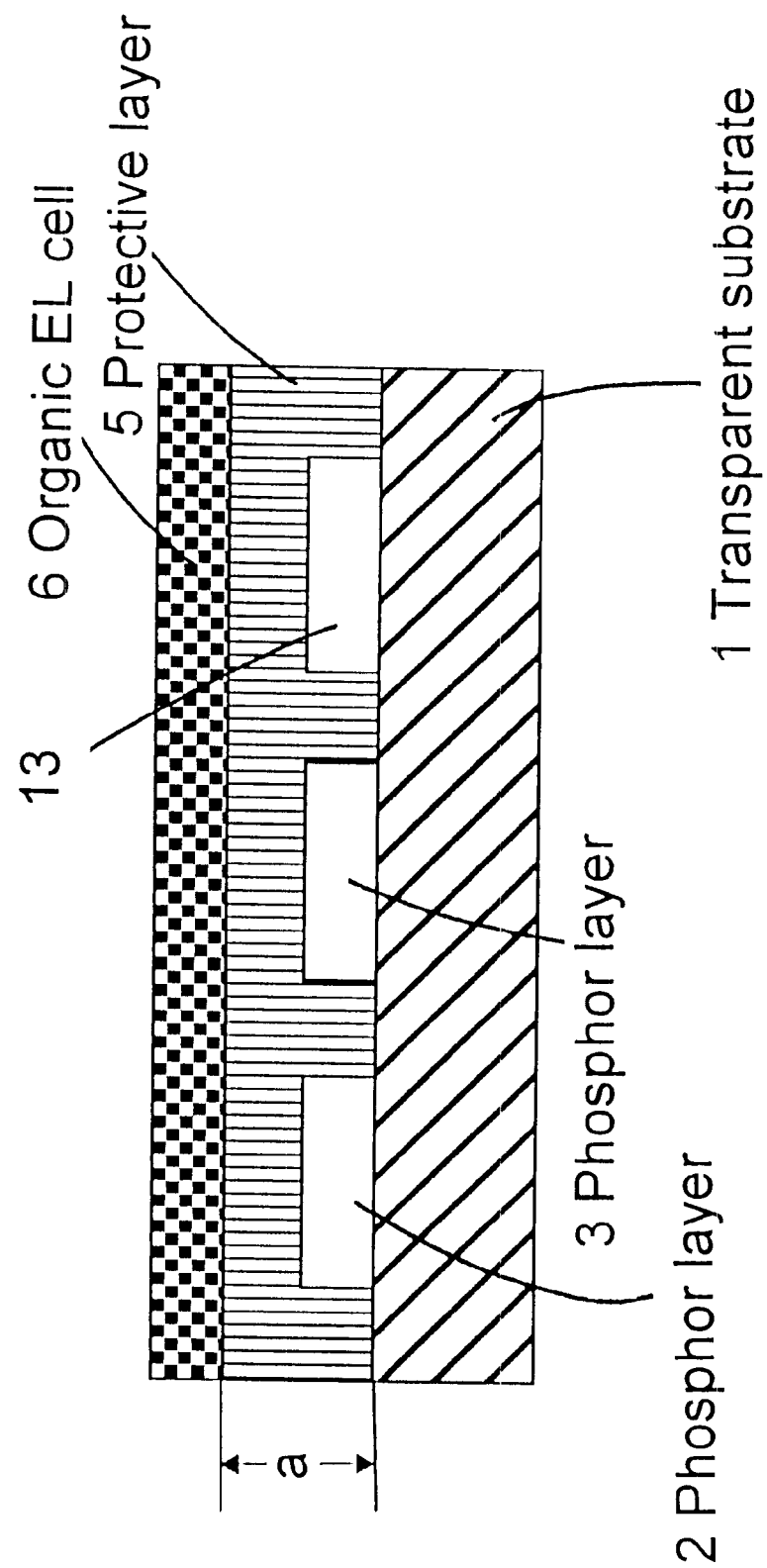
FIG. 5 is a sectional view, similar to FIG. 1, showing another embodiment of the invention.

The color conversion filter comprises three kinds of phosphor layers for red 2, green 3 and blue 4, arranged in a discrete manner on the surface of substrate 1, such as a glass substrate. The phosphor layers can be formed by any known method, such as photolithography or micelle electrolysis. In one embodiment of the invention, one of the phosphor layers is replaced by a color filter 13 (FIG. 5) which emits a light with the same color purity as that of a light emitted by the organic light emitting layer of the organic EL cell.

The protective layer of the color conversion filter uses highly transparent and highly adhesive coating resin with transparency of 50% or more at wavelengths, for instance, in the range of 400–700 nm. A coating resin with a glass transition temperature Tg of 100° C. or more and surface hardness of 2H or more on the basis of a pencil hardness when cured is used. The protective layer must be coated on the color conversion filter on the order of the thickness of $\mu$m. When the transparent conductive film is formed with a sputtering method and the like directly on the protective layer, if the protective layer has Tg less than 100° C., the protective layer may have a possibility of roughing on the surface thereof without withstanding the sputtering, so that Tg is more than 100° C. The coating resin for the protective layer is selected from the materials that do not deteriorate the color conversion efficiency of the phosphor layers.

Suitable resins for the protective layer are thermoplastic resin, such as polycarbonate (PC) resin, polyethyleneterephthalate (PET) resin, polyethersulphon resin, polyvinylbutyral resin, polyphenyleneether resin, polyamide resin, polyetherimide resin, polynorbornene resins, polymethacrylate resin, isobutylene-maleic anhydride copolymer resin, polycyclicolefin resin. Other suitable resins are thermosetting resin, such as epoxy resin, phenol-formaldehyde resin, polyacrylate resin, polyvinylester resin, polyimide resin, polyurethan resin, urea-formaldehyde resin, melaminformaldehyde resin. Still other suitable resins are polymer hybrid resin, such as polystyrene resin, polyacrylonitrile resin, or polycarbonate resin, incorporated with trialkoxysilane or tetraalkoxysilane.

Polynorbornene resins are particularly preferable coating resins for the protective layer, since polynorbornene resins do not badly affect the phosphor layers and have an excellent transparency. The coating resin with low molecular weight dissolves the phosphor layers, and is likely to deactivate the phosphor material in the phosphor layers. Furthermore, the coating resin with low molecular weight may develop cracks in the protective layer when the organic EL cell is formed on the protective layer. On the other hand, the coating resin with high molecular weight will provide improved film strength. However, the coating resin with high molecular weight has low solubility in a solvent, rendering the formation of the protective layer difficult. Therefore, the preferable coating resin is polynorbornene resin with number average molecular weight ranging from 50,000 to 500,000.

Hardening at a too low temperature may shorten the life of the color conversion filter due to moisture and organic solvent, etc. remaining in the protective layer. On the other hand, Japanese Unexamined Patent Publication No. 8-279394 teaches that hardening at a high temperature of 200° C. or more lowers the color conversion efficiency due to thermally induced quenching of the phosphor material in the phosphor layers. Therefore, the desirable temperature for the formation of the protective layer is in the range of 100 to 200° C. The experiments by the inventors show that hardening at a temperature of 150° C. or more still lowers the color conversion efficiency of the color conversion filter. Therefore, more preferable temperature of the film formation is in the range between 100° C. and 150° C.

Polymer hybrid resin incorporating a base polymer having aromatic rings, such as polystyrene or polycarbonate, is suitable for use as a material for forming a protective layer because such a polymer hybrid provides a film with high surface hardness.

For a coating method of the protective layer 5, any known method may be used, such as spin coating, roll coating or casting. Hardening of the coating resin is also not limited to a special method. Hardening by thermal, photo, chemical or hygro-hardening, or a combination thereof may be used. However, in the thermal hardening, it is preferable to heat at a temperature of about 150° C. or less to prevent deterioration of the phosphor materials. In addition, in the photohardening, it is preferable to conduct with a visible light region to prevent deterioration of the phosphor materials.

A gas barrier layer may be formed between the protective layer 5 and organic EL cell 6, as required. The gas barrier layer should be impervious to gas and organic solvent to protect the organic EL cell. In addition, the gas barrier layer should have high transparency, and be formed of a thin film from nm to μm order of the thickness to have a hardness of withstanding the stress during the process of anode formation. A preferable material for the gas barrier layer includes polymer and inorganic oxide, etc. which has a pencil hardness of 2H or more.

The organic EL cell 6 formed directly on the protective layer 5 emits light preferably in the range from near ultraviolet to visible bluish green. A specific layer formation is:

(1) anode (transparent electrode)/organic light-emitting layer/cathode,
(2) anode (transparent electrode)/hole-injecting layer/ organic light-emitting layer/cathode,
(3) anode (transparent electrode)/organic light-emitting layer/electron-injecting layer/cathode,
(4) anode (transparent electrode)/hole-injecting layer/ organic light-emitting layer/electron-injecting layer/ cathode.

Organic EL cell 6 is manufactured by a conventional method disclosed in the following references; Japanese Unexamined Patent Publications No. 5-21163, No. 5-114487, No. 5-94876, No. 5-94877, No. 5-125360, No. 5-134430, No. 6-200242, No. 6-234969, No. 7-11245, No. 7-11246, No. 7-142168, No. 7-282975, No. 8-213171, No. 8-227276, No. 8-236273, No. 8-279394, No. 8-302340, No. 8-315981, No. 9-022782, No. 9-102393, No. 9-153395, No. 9-204983, No. 9-204984, No. 9-204985, No. 9-209127, No. 9-232075, No. 9-272864, No. 9-283279, No. 9-293589, No. 9-298090, No. 9-306666, No. 9-306668, No. 9-330791, No.9-330792, No. 10-012378, No. 10-012379, No. 10-012380, No. 10-012383, No. 10-022072, No. 10-022076, No. 10-039792, No. 10-069981, No. 10-083889, No. 10-092583, No. 10-106746, No. 10-106753, No. 10-125471, No. 10-125472 and No. 10-125473.

The followings are examples of the multi-colored organic EL device.

As an anode material for the organic EL cell, indium tin oxide (ITO) was used, and as organic materials for the EL cells, copper phthalocyanine (CuPc), 4,4'-bis[N-(1-naphthyl)-N-phenylamino] biphenyl(α-NPD), 4,4'-bis(2,2-diphenylvinyl)biphenyl(DPVBi), and aluminum chelate (Alq) were used. However, the materials for the organic EL cells are not limited to those cited above.

EXAMPLE 1

A multi-colored organic EL element as schematically shown in FIG. 1 was formed by the following steps:

Fabrication of Color Conversion Filter

A color filter blue material (Color Mosaic CB-7001 made by FUJIFILM Olin Co., Ltd.) was spin-coated on a glass substrate 1, and patterned with strips by photolithography. This gave a phosphor layer for blue 4 the strip pattern of 0.1 mm wide, 0.33 mm pitch, and 10 μm thick. Then, an alkali soluble negative type photoresist agent dispersed with coumalin 6 (made by Aldrich Corporation) was spin-coated and patterned with strips by photolithography, and heated at 150° C. This gave a phosphor layer for green 3 the strip pattern of 0.1 mm wide, 0.33 mm pitch, and 15 μm thick. Then, an alkali soluble negative type photoresist agent dispersed with rhodamine 6G (made by Aldrich Corporation) was spin-coated and patterned with strips by photolithography, and heated at 100° C. This gave a phosphor layer for red 2 the strip pattern of 0.1 mm wide, 0.33 mm pitch, and 15 μm thick.

Fabrication of Protective Layer

Polynorbornene resin with a number average molecular weight of about 100,000 ("ARTON" made by Japan Synthetic Rubber Co. Ltd.) diluted with toluene was spin-coated on the color conversion filter, and vacuum-dried at 120° C. This gave a protective layer of 7 μm thick. The formed protective layer was transparent and had an even surface. Tg of the formed protective layer was 165° C.

Fabrication of Organic EL Cell

Anode, Organic Layer and Cathode

Figure 2:
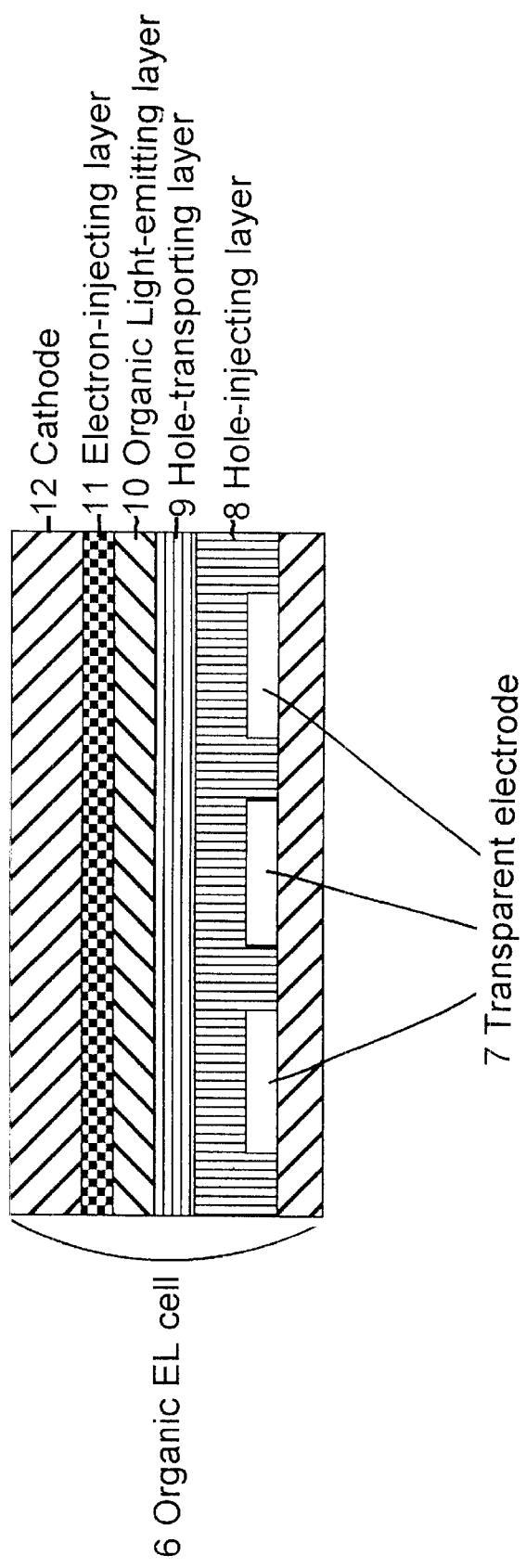
FIG. 2 is a schematic cross sectional view of an organic EL cell referred to in Example 1.

FIG. 2 is a schematic cross sectional view of an organic EL cell 6 in Example 1. The organic EL cell formed on the color conversion filter is composed of six layers: transparent electrode 7/hole-injecting layer 8/hole-transporting layer 9/light-emitting layer 10/electron-injecting layer 11/cathode 12.

Indium tin oxide (ITO) was sputtered all over the protective layer formed on the color conversion filter. A photoresist agent (OFPR-800 made by Tokyo Ohka Kogyo Co., Ltd.) was applied on the indium tin oxide layer. A mask with a pattern of 0.096 mm wide, and 0.11 mm pitch was positioned and adjusted to the pattern of the color conversion filters underneath. And, the indium tin oxide layer was exposed to light of the energy intensity of 200 mJ/cm² at a wave length of 365 nm and patterned by using a developing liquid (NMD-3 made by Tokyo Ohka Kogyo Co., Ltd.), resulting in transparent ITO electrodes.

Next, the substrate with the color conversion filter and transparent electrode thereon was installed in a resistance-heated vacuum deposition chamber, and a successive deposition of hole-injecting layer 8, hole-transporting layer 9, organic light-emitting layer 10, and electron-injecting layer 11 was conducted at a pressure of 1×10⁻⁴ Pa. Hole-injecting layer 8 with the thickness of 100 nm was formed by depositing copper phthalocyanine (CuPc) represented by the following formula.

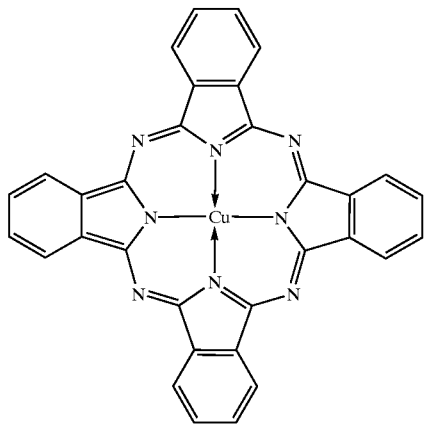

Hole-transporting layer 9 with a thickness of 20 nm was formed by depositing 4,4'-bis[N-(1-naphtyl)-N-phenylamino]biphenyl(α-NPD) represented by the following formula.

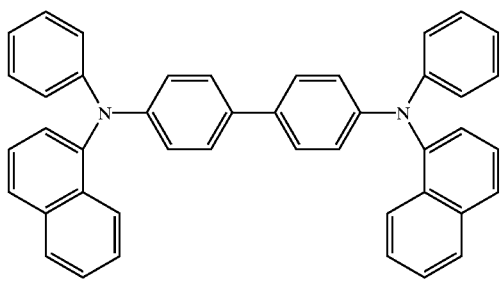

Organic light-emitting layer 10 with a thickness of 30 nm was formed by depositing 4,4'-bis(2,2-diphenylvinyl)biphenyl(DPVBi) represented by the following formula.

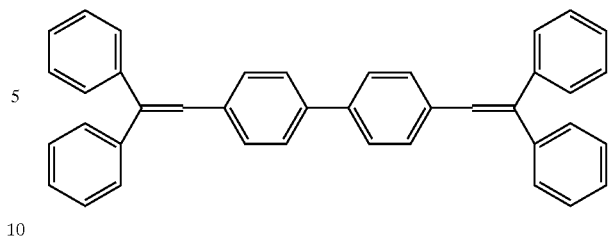

Electron-injecting layer 11 with a thickness of 20 nm was formed by depositing aluminum chelate (Alq) represented by the following formula.

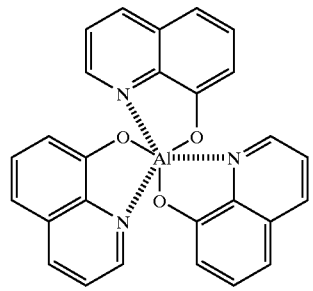

Then, the substrate was taken out of the vacuum deposition chamber, and installed in another resistance-heated vacuum deposition chamber to form a cathode 12 with a thickness of 200 nm with Mg/Ag alloy in a weight ratio of 10 to 1.

EXAMPLE 2

Coating liquid containing polystyrene and trialkoxysilane was spin-coated on the color conversion filter fabricated by the same method as in Example 1. After air-drying at 80° C. and vacuum-drying at 120° C, transparent and even protective layer of 7 μm thick was obtained. An organic EL cell (anode, organic layer, and cathode) was formed on the protective layer in the same manner as described in Example 1.

EXAMPLE 3

Polycyclic olefin resin (Zeonex made by Nippon Zeon Co., Ltd.) diluted with toluene was spin-coated on the color conversion filter fabricated by the same method as in Example 1, and vacuum-dried at 120° C. to obtain a protective layer which is transparent and even, and has 7 μm thick. Tg of the protective layer formed was 130° C. An organic EL cell (anode, organic layer and cathode) was formed on the protective layer in the same manner as those described in Example 1.

Comparative Example 1

Ultraviolet-hardening resin (SD-715 made by Dainippon Ink and Chemicals, Inc.) was spin-coated on the color conversion filter fabricated by the same method as in Example 1, and was irradiated with light of an energy intensity of 100 mW/cm² for 30 seconds by a high pressure mercury lamp to obtain a protective layer of 3 μm thick. An organic EL cell (anode, organic layer and cathode) was formed in the same manner as described in Example 1.

Comparative Example 2

Acrylic resin diluted with toluene was spin-coated on the color conversion filter fabricated by the same method as in Example 1, and vacuum-dried at 120° C. to form a protective layer of 7 μm thick, which is transparent and even. Subsequent sputtering of an ITO electrode on the protective layer made a protective layer rough and remarkably less transparent.

Comparative Example 3

Polynorbornene resin with a number average molecular weight of about 20,000 diluted with toluene was spin-coated on the color conversion filter fabricated by the same method as in Example 1, and vacuum-dried at 120° C. to obtain a protective layer of 7μm thick.

An organic EL cell was formed on the protective layer in the same manner as in Example 1. However, sputtering an ITO electrode on the protective layer resulted in cracks in the protective layer and breaks within the ITO electrode derived from the cracks.

Evaluation

Table 1 describes an evaluation of five devices referred to in Example 1, Example 2, Example 3, Comparative Example 1 and Comparative Example 2. In Table 1, Ha denotes a surface hardness of the protective layer; Tg indicates Tg of the protective layer; a is a thickness of the protective layer; Ra is a flat-coating property or center average roughness; Ts indicates strength of the protective layer when sputtering an ITO electrode; Ap shows an effect of the protective layer to phosphor layers; Av is an angle of visibility of the device; and $S_{DS}$ denotes stability in the dark spot.

tive layers of Example 1, Example 2, Example 3, and comparative Example 1. However, sputtering an ITO electrode on the protective layer in Comparative Example 2 caused the protective layer to be rough and inflicted a striking damage to transparency of the protective layer.

Evaluation 4

Angle of Visibility

An angle of visibility is defined as a range of angles in which no practical change in chromaticity coordinates is observed when an organic EL cell emits monochromatic light. Measurements of the angles of visibility show that the devices referred to in Examples 1, 2 and 3 have angles of visibility larger than 80° on either side, and can be practically used.

Evaluation 5

Stability

Figure 3:
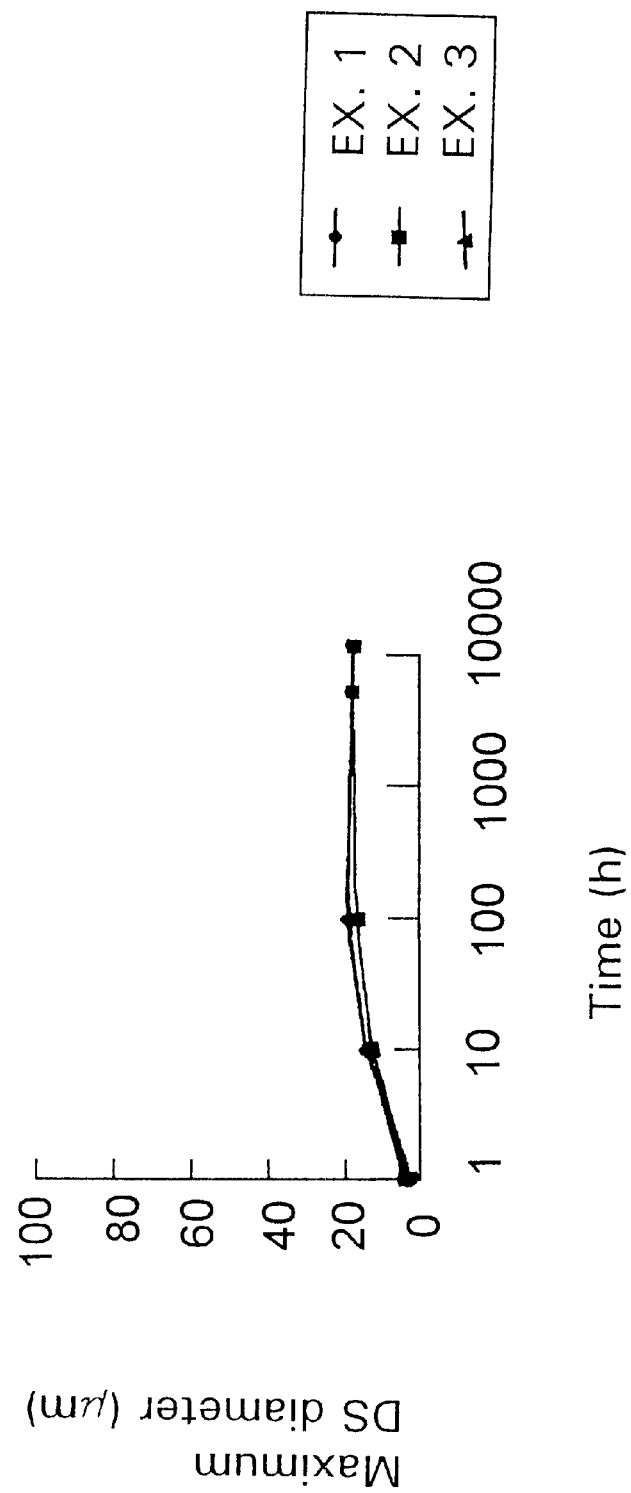
FIG. 3 is a diagram showing a change of a dark spot (DS) size along time in the devices referred to in Examples 1, 2 and 3.
Figure 4:
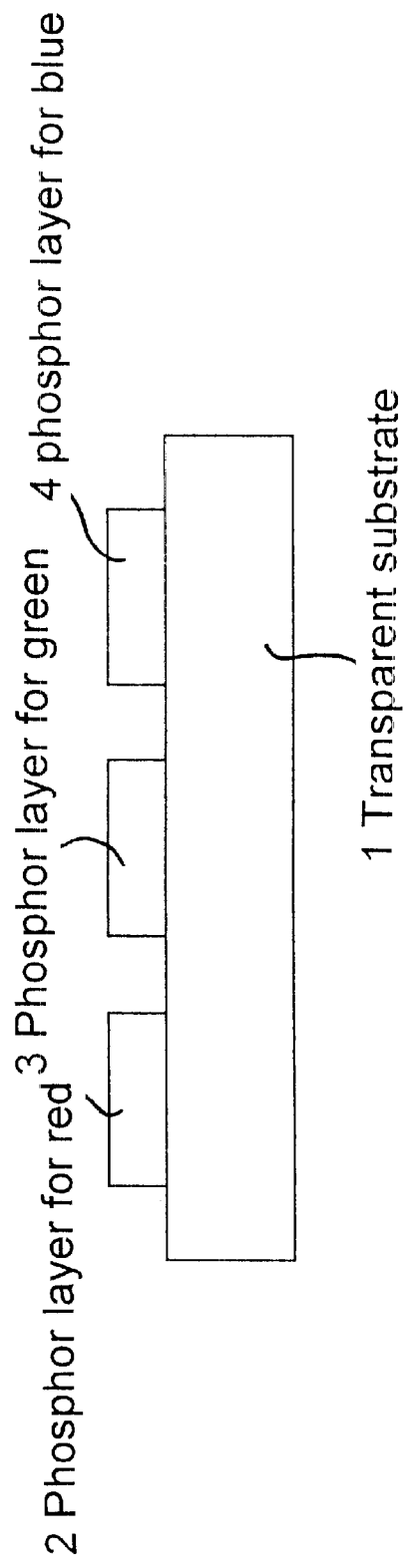
FIG. 4 is a cross sectional view of the conventional color conversion filter on a glass substrate.

FIG. 3 is a diagram showing changes in dark spot (DS) sizes with time in the devices referred to in examples 1, 2, and 3. The devices were preserved under the nitrogen gas stream. Optical microscopic observation at a light emitting part (2 mm square) of the devices indicated that no growth of the dark spots proceeded and, hence, the devices of Examples 1, 2 and 3 were shown stable.

Evaluation 6

Effect to the Phosphor Layer

Each device of Examples 1–3 and Comparative Example 1 was preserved under the nitrogen gas stream. Table 2

TABLE 1

|  | Ha | Tg | a | Ra | Ts | Ap | Av | $S_{DS}$ |
|---|---|---|---|---|---|---|---|---|
| EX. 1 | >2 H | >165° C. | 22 μm | <0.1 μm | ○ | none | >±80° | ○ |
| EX. 2 | >2 H | >100° C. | 22 μm | <0.1 μm | ○ | none | >±80° | ○ |
| EX. 3 | >2 H | >130° C. | 22 μm | <0.1 μm | ○ | none | >±80° | ○ |
| Com. EX. 1 | >2 H | >140° C. | 22 μm | <0.1 μm | ○ | observed | — | — |
| Com. EX. 2 | >2 H | >90° C. | 22 μm | <0.1 μm | x | — | — | — |

Evaluation 1

Thickness of Protective Layer

The thickness "a" of a protective layer referred to in FIG. 1 is an interval from the surface of the transparent substrate 1 to the surface of the protective layer 5. Every forming process yielded the protective layer with a very thin film thickness as shown in Table 1.

Evaluation 2

Flat-coating Property for Color Conversion Filter

Surface roughness of the protective layer was measured by a surface roughness gauge (DEKTAK IIA made by ULVAC Japan, Ltd.). Protective layer surfaces of the devices referred to in Examples 1–3 and Comparative Examples 1–3 had center line average height Ra below 0.1 μm when scanned along a distance of 5 mm. No breakage in a transparent electrode formed on the protective layer was found.

Evaluation 3

Tolerance to Sputtering

Microscopic observation for an appearance of the protective layer indicated that sputtering did not affect the protecshows the CIE chromaticity coordinates of the devices that emit monochromatic light.

TABLE 2

|  | CIE chromaticity coordinates (x, y) | | |
|---|---|---|---|
|  | Red | Green | Blue |
| Ex. 1 | (0.60, 0.33) | (0.24, 0.63) | (0.12, 0.16) |
| Ex. 2 | (0.60, 0.33) | (0.24, 0.63) | (0.12, 0.16) |
| Ex. 3 | (0.60, 0.33) | (0.24, 0.63) | (0.12, 0.16) |
| Com. Ex. 1 | (0.56, 0.28) | (0.24, 0.63) | (0.12, 0.16) |

Table 2 indicates that the phosphor materials coated with the protective layers in the devices of Examples 1–3 maintain stable functions after forming organic EL cells on the protective layers. On the contrary, the device of Comparative Example 1, which employs the protective layer consisting of ultraviolet-hardening resin, deteriorated in characteristics due to a probable damage to the phosphor layer for red.

The present invention provides an economical and easy-to-manufacture multi-colored organic EL device with a wide angle of visibility and satisfactory stability.

While the invention has been explained with reference to specific embodiments of the invention, the explanation is illustrative, and the invention is limited only by the appended claims.

What is claimed is:

1. A multi-colored organic electroluminescence device comprising:

a transparent substrate;

a plurality of different phosphor layers arrayed on a surface of the substrate to be spaced apart from each other;

a protective layer coated flatly on the phosphor layers and being formed of a polynorbornene resin as a coating resin having a curing temperature at which quenching of fluorescence for the phosphor layers does not occur, said polynorbornene resin having a number average molecular weight from 50,000 to 500,000 and formed at a temperature between 100 and 150° C., said protective layer having a glass transition temperature more than 100° C. and surface hardness more than 2H on a pencil hardness; and an organic electroluminescence cell formed on the protective layer and including an organic light-emitting layer for emitting light when electric charges are injected therein, said phosphor layers and said light-emitting layer being arranged such that the phosphor layers absorb luminescence from the light-emitting layer to cause the phosphor layers fluorescent.

2. A multi-colored organic electroluminescence device as claimed in claim 1, wherein said organic light-emitting layer includes a plurality of transparent electrodes disposed above the respective phosphor layers.

3. A multi-colored organic electroluminescence device as claimed in claim 1, wherein said protective layer is coated flatly on the phosphor layers and the substrate.

4. A multi-colored organic electroluminescence device as claimed in claim 1, wherein said coating resin formed at the temperature between 100 and 150° C. does not have moisture and organic solvent therein.

5. A multi-colored organic electroluminescence device comprising:

a transparent substrate;

a plurality of different phosphor layers arrayed on a surface of the substrate to be spaced apart from each other;

a protective layer coated flatly on the phosphor layers and being formed of a polymer hybrid resin as a coating resin having a curing temperature at which quenching of fluorescence for the phosphor layers does not occur, said polymer hybrid resin including alkoxysilane selected from the group consisting of trialkoxysilane and tetraalkoxysilane, and formed at a temperature between 100 and 150° C., said protective layer having a glass transition temperature more than 100° C. and surface hardness more than 2H on a pencil hardness; and an organic electroluminescence cell formed on the protective layer and including an organic light-emitting layer for emitting light when electric charges are injected therein, said phosphor layers and said light-emitting layer being arranged such that the phosphor layers absorb luminescence from the light-emitting layer to cause the phosphor layers fluorescent.

6. A multi-colored organic electroluminescence device as claimed in claim 5, wherein said coating resin formed at the temperature between 100 and 150° C. does not have moisture and organic solvent therein.

7. A multi-colored organic electroluminescence device comprising:

a transparent substrate;

a plurality of different phosphor layers and a color filter operating as one of the phosphor layers, which are arrayed on a surface of the substrate to be spaced apart from each other;

a protective layer coated flatly on the phosphor layers and being formed of a coating resin formed at a temperature between 100 and 150° C. and having a curing temperature at which quenching of fluorescence for the phosphor layers does not occur, said protective layer having a glass transition temperature more than 100° C. and surface hardness more than 2H on a pencil hardness, said coating resin being formed of a polynorbornene resin with number average molecular weight from 50,000 to 500,000, or a polymer hybrid resin including alkoxysilane selected from the group consisting of trialkoxysilane and tetraalkoxysilane; and an organic electroluminescence cell formed on the protective layer and including an organic light-emitting layer for emitting light when electric charges are injected therein, said phosphor layers, said color filter and said light-emitting layer being arranged such that the phosphor layers absorb luminescence from the light-emitting layer to cause the phosphor layers fluorescent and said color filter transmits light with a same purity of color as that of light from the organic light-emitting layer.

8. A multi-colored organic electroluminescence device as claimed in claim 7, wherein said coating resin formed at the temperature between 100 and 150° C. does not have moisture and organic solvent therein.

* * * * *

UNITED STATES PATENT AND TRADEMARK OFFICE
CERTIFICATE OF CORRECTION

PATENT NO. : 6,563,263 B1
DATED : May 13, 2003
INVENTOR(S) : Koji Kawaguchi et al.

It is certified that error appears in the above-identified patent and that said Letters Patent is hereby corrected as shown below:

Column 1,
Line 5, after "INVENTION" add -- and --;
Line 59, change "wave length" to -- wavelength --;

Column 6,
Line 5, remove "25" before "8-227276,";
Line 59, bracket "Anode, Organic Layer and Cathode"; and Column 9,
Line 25, change "a" (first occurrence) to -- $\underline{a}$ --.

Signed and Sealed this

Ninth Day of September, 2003

JAMES E. ROGAN
*Director of the United States Patent and Trademark Office*